(12) United States Patent
Theuss

(10) Patent No.: US 7,579,268 B2
(45) Date of Patent: Aug. 25, 2009

(54) METHOD OF MANUFACTURING AN INTEGRATED CIRCUIT

(75) Inventor: Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 48 days.

(21) Appl. No.: 11/757,724

(22) Filed: Jun. 4, 2007

(65) Prior Publication Data
US 2007/0287225 A1 Dec. 13, 2007

(30) Foreign Application Priority Data
Jun. 2, 2006 (DE) .................. 10 2006 025 960

(51) Int. Cl.
*H01L 21/44* (2006.01)

(52) U.S. Cl. .............. 438/617; 438/118; 438/406; 438/455; 257/E21.122; 257/E21.088; 257/E21.526

(58) Field of Classification Search ............ 438/118, 438/406, 455, 612, 617, FOR. 142, FOR. 343, 438/FOR. 368, 156, 60, 228, 65, 471, 758; 257/E21.122, E21.088, E21.526
See application file for complete search history.

(56) References Cited

U.S. PATENT DOCUMENTS

| | | | | |
|---|---|---|---|---|
| 4,235,648 A * | 11/1980 | Richardson | ................ | 438/635 |
| 5,193,014 A * | 3/1993 | Takenouchi et al. | ............ | 359/3 |
| 5,492,863 A * | 2/1996 | Higgins, III | ................ | 438/610 |
| 6,372,624 B1 * | 4/2002 | Farnworth et al. | .......... | 438/614 |
| 6,492,255 B2 * | 12/2002 | Enomoto et al. | ............ | 438/614 |
| 6,503,343 B1 * | 1/2003 | Tench et al. | ................ | 148/272 |
| 6,664,874 B2 * | 12/2003 | Shirasaki | ................... | 333/247 |
| 6,696,347 B1 * | 2/2004 | Hikita et al. | ................ | 438/406 |
| 6,817,073 B2 * | 11/2004 | Uchiyama et al. | .......... | 29/25.35 |
| 6,900,117 B2 * | 5/2005 | Yoda | ......................... | 438/612 |
| 6,905,915 B2 * | 6/2005 | Yuzawa | ..................... | 438/126 |
| 7,148,608 B2 * | 12/2006 | Baumgartner et al. | ....... | 310/334 |
| 2001/0020546 A1 * | 9/2001 | Eldridge et al. | ............ | 174/261 |
| 2001/0036711 A1 * | 11/2001 | Urushima | ................... | 438/460 |
| 2001/0040290 A1 * | 11/2001 | Sakurai et al. | .............. | 257/737 |
| 2002/0117330 A1 * | 8/2002 | Eldridge et al. | ............ | 174/260 |
| 2003/0219926 A1 * | 11/2003 | Yuzawa | ..................... | 438/106 |
| 2004/0132230 A1 * | 7/2004 | Kim | ........................... | 438/106 |
| 2006/0126313 A1 * | 6/2006 | Steiner et al. | .............. | 361/760 |
| 2006/0292750 A1 * | 12/2006 | James et al. | ................ | 438/118 |

FOREIGN PATENT DOCUMENTS

| | | |
|---|---|---|
| JP | 2001358173 A | 12/2001 |
| WO | 01/20676 A1 | 3/2001 |
| WO | 2005/064668 A1 | 7/2005 |

\* cited by examiner

*Primary Examiner*—N Drew Richards
*Assistant Examiner*—Ankush k Singal
(74) *Attorney, Agent, or Firm*—Edell, Shapiro & Finnan, LLC

(57) ABSTRACT

A method of manufacturing an integrated circuit including a first isolated chip electrically and mechanically connected via wafer bonding to a second isolated chip, wherein the active faces of the chips face one another, includes: forming metallic contact zones on active faces of first and second wafers, positioning and fixing the wafers one above another at a predetermined distance such that the active faces of the wafers face one another and the contact zones are aligned, placing the fixed wafers in a bath for electroless metal deposition onto the contact zones; and removing the fixed wafers in the event that the metal layers growing on the aligned contact zones of the first and second wafers have grown together.

24 Claims, 4 Drawing Sheets

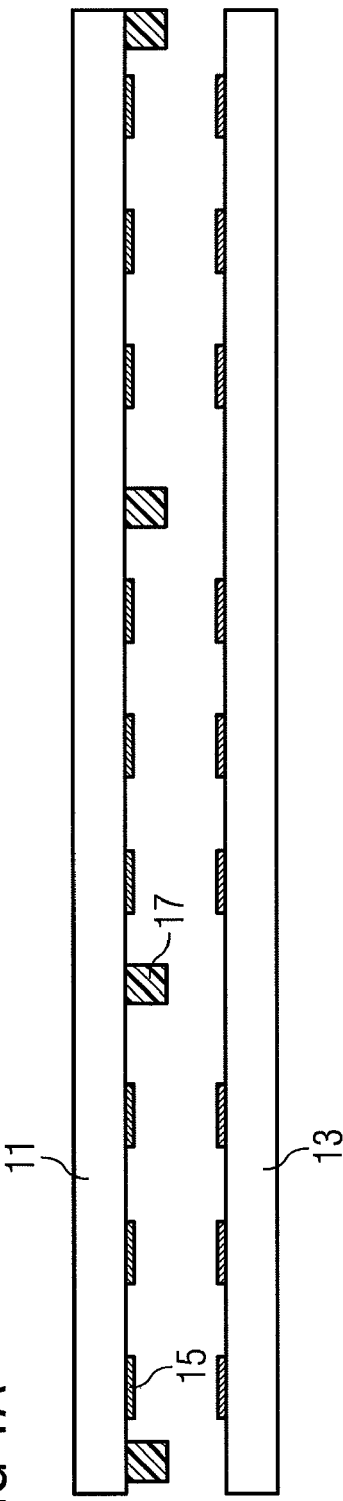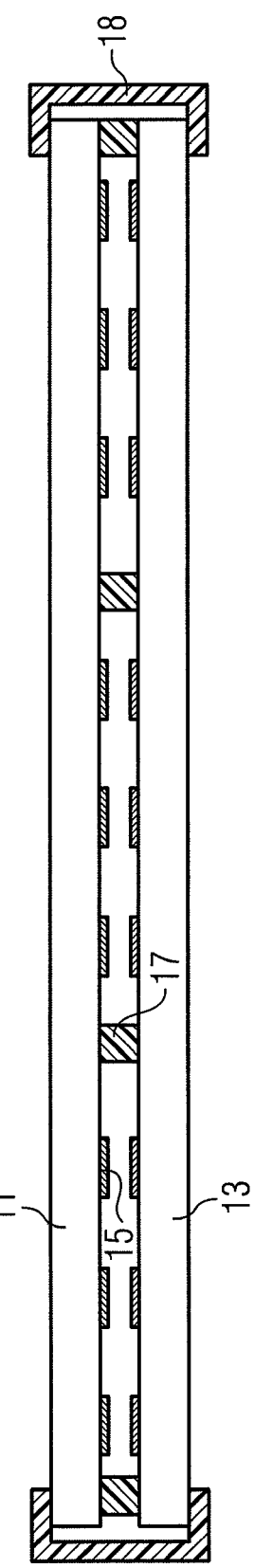

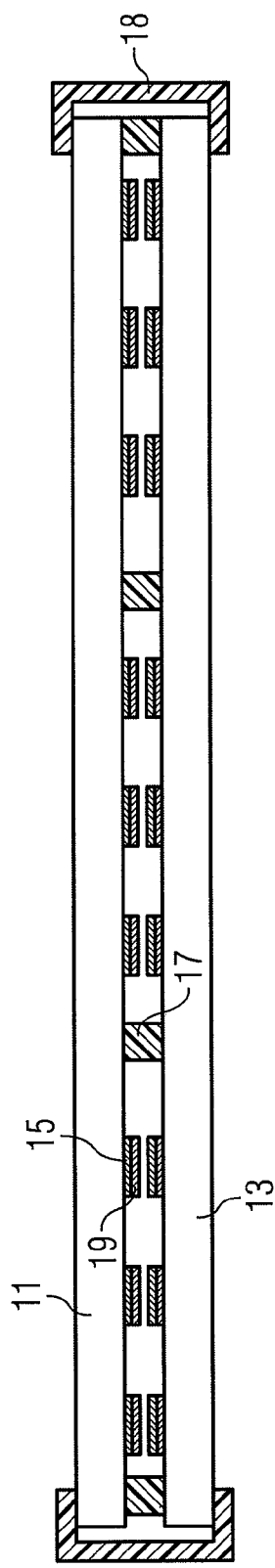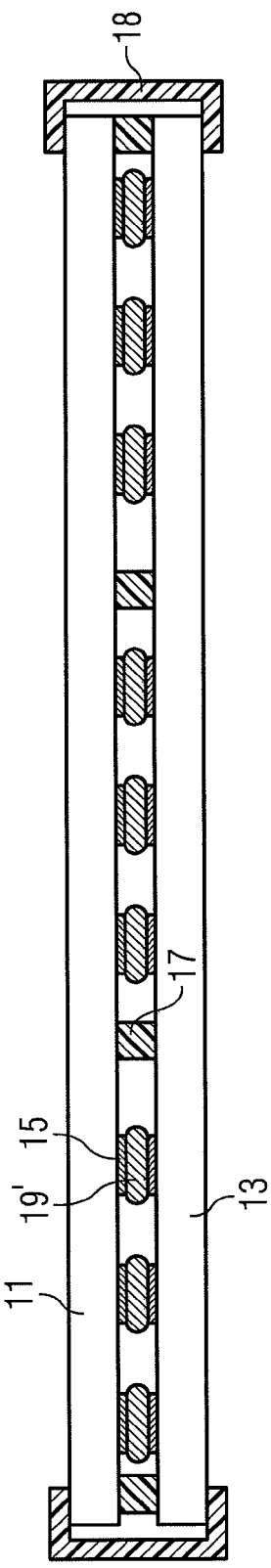

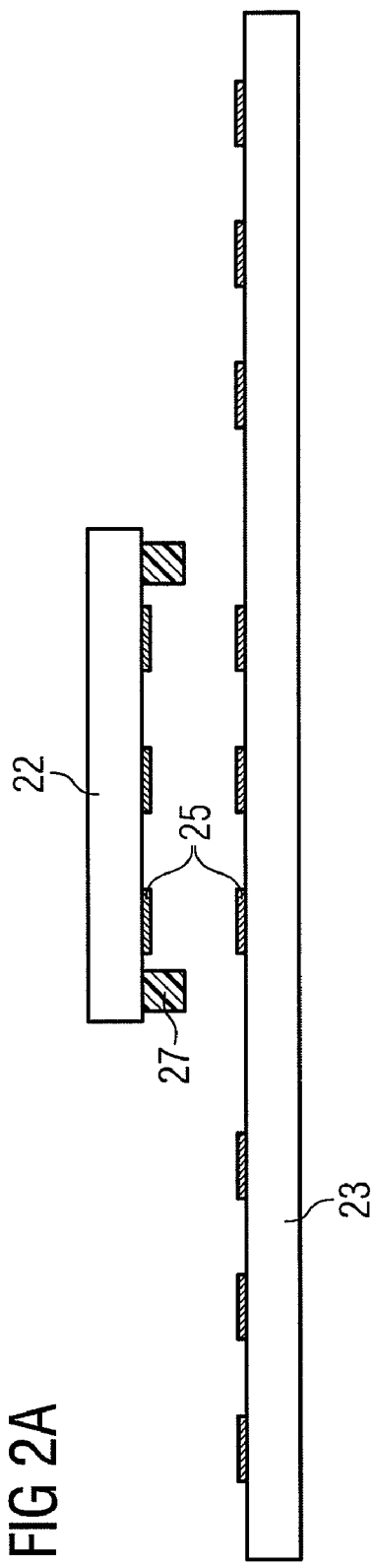
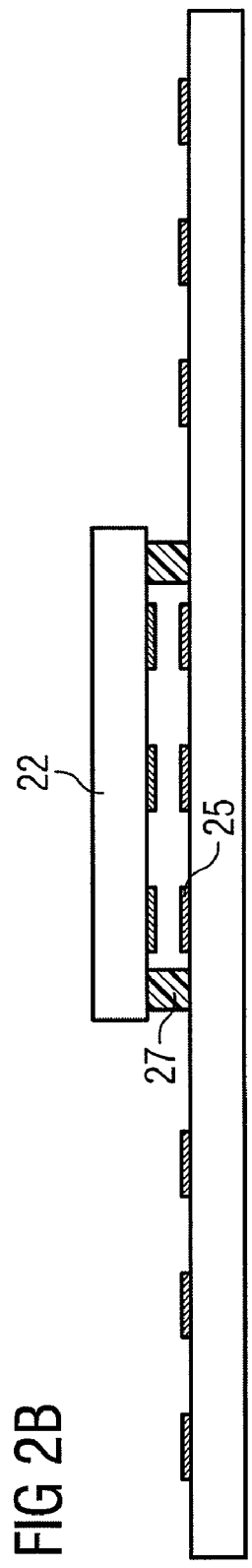
FIG 2A
FIG 2B

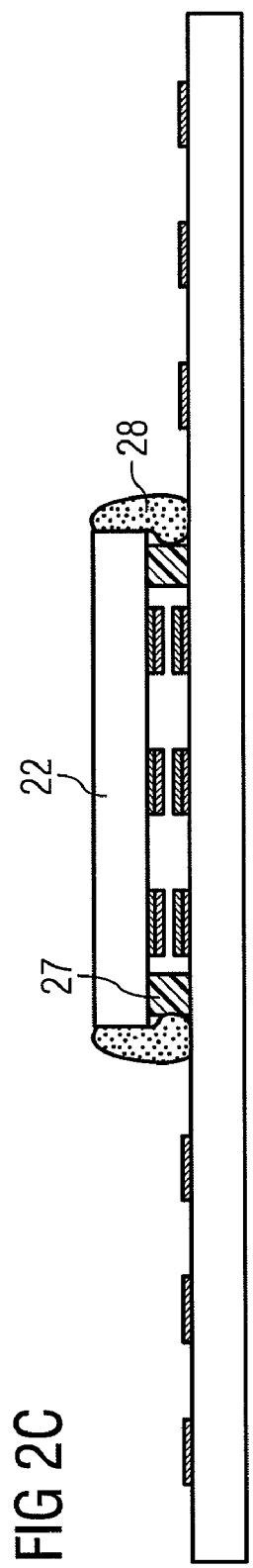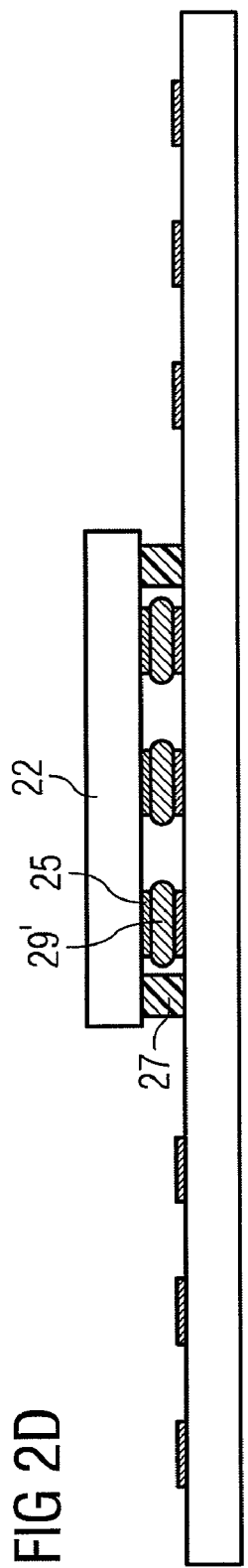

METHOD OF MANUFACTURING AN INTEGRATED CIRCUIT

CROSS REFERENCE TO RELATED APPLICATIONS

This application claims priority under 35 U.S.C. §119 to Application No. DE 102006025960.2 filed on Jun. 2, 2006, entitled "Process for the Production of an Integrated Semiconductor Unit," the entire contents of which are hereby incorporated by reference.

BACKGROUND

So-called wafer bonding, involving the creation of electrically conductive connections between the circuits (chips) in two semiconductor wafers prior to separation, i.e., between two complete wafers, has established itself as one of the assembly techniques used in semiconductor technology. The term "face-to-face technology" as used in the following, is intended to mean the positioning of two wafers with respect to one another with the active faces of the integrated circuits facing one another and the connections being established in this state.

The following techniques are known in the field of these face-to-face technologies:

wafer bonding via diffusion soldering (e.g., with the Cu—Sn or Au—Sn solder combination), wafer bonding via anodic bonding, wafer bonding via conductive adhesive connections, wafer bonding via plug and clip connections (e.g., by insertion of Au stud bumps in via holes), and wafer bonding via friction welding connections.

These techniques are known to those skilled in the art as such and therefore do not require any further explanation (also, details are not relevant to an understanding of the present invention).

One common characteristic of all these techniques is the need to maintain a high degree of coplanarity between the mutually opposite wafers during the entire joining process. This calls for great complexity of the adjustment and fixing facilities and therefore increases the cost of the relevant processes. Additionally, high pressures are often needed to produce the wafer-to-wafer bond, therefore posing the risk of breaking a wafer or of damaging subsystems on the wafer or even of components in the manufacturing fixture.

SUMMARY

Described herein is a method of manufacturing an integrated circuit including a first isolated chip electrically and mechanically connected via wafer bonding to a second isolated chip, wherein the active faces of the chips face one another. Accordingly to an exemplary embodiment, the method includes: forming metallic contact zones on active faces of first and second wafers, positioning and fixing the wafers one above another at a predetermined distance such that the active faces of the wafers face one another and the contact zones are aligned, placing the fixed wafers in a bath for electroless metal deposition onto the contact zones; and removing the fixed wafers in the event that the metal layers growing on the aligned contact zones of the first and second wafers have grown together.

The above and still further features of the invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The method is explained in more detail below with reference to the accompanying drawings, where:

FIGS. 1A to 1D show schematic depictions of steps of a first embodiment of a method; and FIGS. 2A to 2D show schematic depictions of steps of a second embodiment of a method.

DETAILED DESCRIPTION

The process described herein includes forming electrical connections during wafer bonding via mutually aligned growth of metal layers on prepared contact faces of two wafers in a bath for electroless metal deposition. The process further includes providing suitable metallic contact zones on the two wafers in such an arrangement that these contact zones are opposite one another when the two wafers are positioned over one another in a manner adapted to this arrangement (e.g., in the case of wafer-wafer bonding) or when one chip is positioned over a whole wafer (e.g., in the case of chip-wafer bonding). Complete overlapping of the mutually opposite contact zones is not necessary.

The process proposed can be used for both face-to-face bonding of two whole wafers and also of individual chips with a whole wafer. In the latter mentioned variant, one or several single chips previously tested as good can be positioned opposite chips also already tested as good in a still unsplit wafer and can be joined to it, thus making it possible to substantially increase the yield of the process.

In the case of the process proposed, it is intended for one step of applying a germ layer on the metallic contact zones to occur prior to placement of the first and second wafers, (i.e., in the case for wafer to wafer bonding), or the first chip and the second wafer, (i.e., in the case for chip to wafer bonding), in the electroless deposition bath. Optionally, the germ layer is applied subsequent to the two wafers or the chip and the wafer being placed one above the other, (i.e., after establishment of face-to-face positioning). Optionally, application of the germ layer may comprise zincate germination. As an alternative, the germ layer can be applied as a sputtered layer to create a metallic seed layer.

A spacer pattern is optionally applied to the wafer to adjust a distance between the two wafers during wafer bonding that is substantially constant over the wafer surface (which may also be suitable for use during chip-wafer bonding). Likewise, the spacer pattern is optionally applied and suitable during chip-wafer bonding. The spacer pattern can be formed as a pattern comprising photoresist islands and subsequently created via conventional photoresist coating and structuring techniques.

Fixing of the positions between the two wafers or the chip or chips and the wafer can be realized as, for example, temporary adhesion or jamming together.

A bath for creation of a nickel layer is optionally used for electroless metal deposition; as an alternative, however, baths for electroless deposition of other metals (e.g., gold) can also be considered.

To achieve a high-grade process result, it is important that a metal deposition rate value that is constant within a predetermined tolerance range is kept to in the electroless deposition bath over the faces, lying one above the other, of the first and second wafers or of the first chip and the second wafer. Therefore, generation and maintenance of a homogeneous flow running parallel to the face-to-face wafer surfaces in the plating bath may be used as a suitable measure for maintaining the metal deposition rate value within the predetermined tolerance range.

As cross-sectional diagrams, FIGS. 1A to 1D schematically show a first and second wafer 11, 13, on which a plurality of Al pads 15 is arranged as metallic contact zones largely oriented toward one another in the depicted state of placement of the wafers 11, 13 one above the other with active faces facing one another (not depicted). A pattern of photoresist spacers 17 is also applied on the first wafer 11.

In the state shown in FIG. 1B, the wafers are placed so close together that the faces of the photoresist spacers 17 on the first wafer 11 meet with the free surface of the second wafer 13. In this state, the wafers 11, 13 are fixed in place via a clamping fixture 18 shown schematically here; however, they can also be fixed in place via suitable adhesive islands or lanes. In this state, the Al pads 15 are prepared for subsequent electroless plating, for example, via zincate germination (not depicted) or sputtering on of a metallic seed layer.

Subsequently, the wafers 11, 13 fixed to one another are placed in a bath for electroless Ni deposition, and a Ni layer 19 begins to grow on the opposing Al pads 15, which are germinated or provided with a seed layer (cf., FIG. 1C). In the state shown in FIG. 1D, in which the Ni layers opposite and growing towards one another have grown into a coherent layer 19', the deposition process is stopped or the wafers 11, 13 now electrically and mechanically connected to one another are removed from the bath.

FIGS. 2A to 2D basically show the same process sequence, the difference being that, here, chip-wafer bonding (i.e., whose connection with a wafer 23 is established via electroless metal deposition), is shown with reference to the example of one single chip 22. In these figures, the designations of the other parts are based on those of FIGS. 1A to 1D, and the corresponding parts and steps are not described here again.

However, it must be pointed out that alternatively, in the second embodiment shown here, the chip 22 is fixed on the wafer 23 via a peripheral adhesive track 28 (as shown symbolically in FIG. 2C) instead of a clamping fixture 18 for fixing the first wafer 11 on the wafer 13 (as shown symbolically in FIG. 1B). In the final state shown in FIG. 2D, with Ni layers grown together onto the opposing Al pads 25 to form Ni joints 29', this adhesive track is no longer shown; it may, however, still be present in subsequent process steps (e.g., sorting, etc.). Removal or loading of the spacers 27 after establishment of the Ni joints between the contact zones also depends on the specifics and requirements of the subsequent process steps.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method of manufacturing an integrated circuit including a first isolated chip electrically and mechanically connected via wafer bonding to a second isolated chip, wherein active faces of the chips face one another, the method comprising:

forming metallic contact zones on active faces of first and second wafers such that, in the event the wafers are arranged one above the other and the active faces of the wafers are facing one another, the contact zones of the first wafer align with the contact zones of the second wafer;

positioning and fixing at a first distance the first and second wafers one above the other with the active faces of the wafers facing one another and with the contact zones of the wafers aligned;

placing the positioned and fixed first and second wafers into a bath for electrolessly depositing metal onto the contact zones;

applying a seed layer on the metallic contact zones prior to placing the positioned and fixed first and second wafers in the electroless deposition bath and subsequent to positioning and fixing the first and second wafers one above the other;

removing the positioned and fixed first and second wafers from the bath in the event metal layers growing on the aligned contact zones have grown together, thereby mechanically and electrically connecting at least one pair of chips of the first and second wafers; and isolating the at least one pair of electrically and mechanically connected chips from the wafers.

2. The method according to claim 1, wherein the seed layer is applied via sputtering to create a metal seed layer.

3. The method according to claim 1, further comprising:

forming a photoresist spacer pattern on at least one of the first or second wafers prior to positioning the first and second wafer one above the other.

4. The method according to claim 1, wherein the first and second wafer are fixed at a first distance via clamping or adhesion.

5. The method according to claim 1, wherein the electroless metal deposition bath is a bath to deposit nickel or gold.

6. The method according to claim 1, wherein a metal deposition rate value over the faces, lying one above the other, of the first and second wafers is held substantially constant within a first tolerance range in the electroless deposition bath.

7. The method according to claim 1, wherein an essentially homogenous flow oriented in parallel with the wafer surface is generated in the electroless metal deposition bath.

8. A method of manufacturing an integrated circuit including a first isolated chip electrically and mechanically connected via wafer bonding to a second isolated chip, wherein active faces of the chips face one another, the method comprising:

forming metallic contact zones on active faces of first and second wafers such that, in the event the wafers are arranged one above the other and the active faces of the wafers are facing one another, the contact zones of the first wafer align with the contact zones of the second wafer;

positioning and fixing at a first distance the first and second wafers one above the other with the active faces of the wafers facing one another and with the contact zones of the wafers aligned;

placing the positioned and fixed first and second wafers into a bath for electrolessly depositing metal onto the contact zones;

applying a seed layer via zincate germination on the metallic contact zones prior to placing the positioned and fixed first and second wafers in the electroless deposition bath;

removing the positioned and fixed first and second wafers from the bath in the event metal layers growing on the aligned contact zones have grown together, thereby mechanically and electrically connecting at least one pair of chips of the first and second wafers; and isolating the at least one pair of electrically and mechanically connected chips from the wafers.

9. The method according to claim 8, further comprising:
forming a photoresist spacer pattern on at least one of the first or second wafers prior to positioning the first and second wafer one above the other.

10. The method according to claim 8, wherein a metal deposition rate value over the faces, lying one above the other, of the first and second wafers is held substantially constant within a first tolerance range in the electroless deposition bath.

11. The method according to claim 8, wherein an essentially homogenous flow oriented in parallel with the wafer surface is generated in the electroless metal deposition bath.

12. A method of manufacturing an integrated circuit including a first isolated chip electrically and mechanically connected via wafer bonding to a second isolated chip, wherein active faces of the chips face one another, the method comprising:

forming metallic contact zones on active faces of first and second wafers such that, in the event the wafers are arranged one above the other and the active faces of the wafers are facing one another, the contact zones of the first wafer align with the contact zones of the second wafer;

isolating the first chip from the first wafer;

positioning and fixing at a first distance the first chip and the second wafer one above the other with the active face of the first chip and the active face of the second wafer facing one another and with the contact zones of the chip and wafer aligned;

placing the positioned and fixed first chip and second wafer into a bath for electrolessly depositing metal onto the contact zones;

applying a seed layer on the metallic contact zones prior to placing the positioned and fixed first chip and second wafer in the electroless deposition bath and subsequent to positioning and fixing the first chip and second wafer one above the other;

removing the positioned and fixed first chip and second wafer from the bath in the event metal layers growing on the aligned contact zones have grown together, thereby mechanically and electrically connecting at least one pair of chips of the first chip and second wafer; and isolating the at least one pair of electrically and mechanically connected chips from the wafers.

13. The method according to claim 12, wherein the seed layer is applied via sputtering to create a metal seed layer.

14. The method according to claim 12, further comprising:
forming a photoresist spacer pattern on at least one of the first chip or the second wafer prior to positioning the first chip and second wafer one above the other.

15. The method according to claim 12, wherein the first chip and second wafer are fixed at a first distance via clamping or adhesion.

16. The method according to claim 12, wherein the electroless metal deposition bath is a bath to deposit nickel or gold.

17. The method according to claim 12, further comprises:
testing and determining that the first chip from the first wafer is good; and
testing and determining that a second chip from the second wafer is good, prior to positioning and fixing the first chip and the second wafer one above the other.

18. The method according to claim 12, wherein a metal deposition rate value over the faces, lying one above the other, of the first chip and second wafer is held substantially constant within a first tolerance range in the electroless deposition bath.

19. The method according to claim 12, wherein an essentially homogenous flow oriented in parallel with the wafer surface is generated in the electroless metal deposition bath.

20. A method of manufacturing an integrated circuit including a first isolated chip electrically and mechanically connected via wafer bonding to a second isolated chip, wherein active faces of the chips face one another, the method comprising:

forming metallic contact zones on active faces of first and second wafers such that, in the event the wafers are arranged one above the other and the active faces of the wafers are facing one another, the contact zones of the first wafer align with the contact zones of the second wafer;

isolating the first chip from the first wafer;

positioning and fixing at a first distance the first chip and the second wafer one above the other with the active face of the first chip and the active face of the second wafer facing one another and with the contact zones of the chip and wafer aligned;

placing the positioned and fixed first chip and second wafer into a bath for electrolessly depositing metal onto the contact zones;

applying a seed layer via zincate germination on the metallic contact zones prior to placing the positioned and fixed first chip and second wafer in the electroless deposition bath;

removing the positioned and fixed first chip and second wafer from the bath in the event metal layers growing on the aligned contact zones have grown together, thereby mechanically and electrically connecting at least one pair of chips of the first chip and second wafer; and isolating the at least one pair of electrically and mechanically connected chips from the wafers.

21. The method according to claim 20, further comprising:
forming a photoresist spacer pattern on at least one of the first chip or the second wafer prior to positioning the first chip and second wafer one above the other.

22. The method according to claim 20, further comprises:
testing and determining that the first chip from the first wafer is good; and
testing and determining that a second chip from the second wafer is good, prior to positioning and fixing the first chip and the second wafer one above the other.

23. The method according to claim 20, wherein a metal deposition rate value over the faces, lying one above the other, of the first chip and second wafer is held substantially constant within a first tolerance range in the electroless deposition bath.

24. The method according to claim 20, wherein an essentially homogenous flow oriented in parallel with the wafer surface is generated in the electroless metal deposition bath.

* * * * *